United States Patent [19]

Takeuchi et al.

[11] Patent Number: 4,964,923

[45] Date of Patent: Oct. 23, 1990

[54] METHOD OF FORMING A COPPER FILM ON A CERAMIC BODY

[75] Inventors: Yukihisa Takeuchi; Tetsuo Watanabe, both of Nagoya, Japan

[73] Assignee: NGK Insulators, Ltd., Japan

[21] Appl. No.: 879,356

[22] Filed: Jun. 27, 1986

[30] Foreign Application Priority Data

Jul. 26, 1985 [GB] United Kingdom ............... 8518945

[51] Int. Cl.$^5$ ................................................ C23C 8/10
[52] U.S. Cl. ..................................... 148/276; 427/96; 148/282
[58] Field of Search .................... 148/276, 282; 427/96

[56] References Cited

U.S. PATENT DOCUMENTS 3,944,440  3/1976  Franz .................................. 148/6.31
4,525,383  6/1985  Saito ...................................... 427/96

FOREIGN PATENT DOCUMENTS 2746612  4/1979  Fed. Rep. of Germany ..... 148/6.31

*Primary Examiner*—Sam Silverberg
*Attorney, Agent, or Firm*—Arnold, White & Durkee

[57] ABSTRACT

A film containing copper is deposited on a ceramic body, and the film and the ceramic body are heated in an oxidizing atmosphere, whereby the copper is oxidized and bonded to the body to form a metal oxide film thereon. Alternatively, a film containing copper oxide is deposited on a ceramic body, and the film and the ceramic body are heated in a non-reducing atmosphere, whereby the film is bonded to the body to form a metal oxide film thereon. A metal film consisting mainly of copper is deposited on the metal oxide film. The metal film and the metal oxide film are heated at a temperature not exceeding 1083° C. in a non-oxidizing atmosphere, whereby a copper film is formed on the body.

6 Claims, No Drawings

METHOD OF FORMING A COPPER FILM ON A CERAMIC BODY

BACKGROUND OF THE INVENTION

1. Field of the Art

This invention relates to a method of forming a metal film consisting mainly of copper, on a ceramic body, and more particularly to a method of forming a copper film which is free from blisters or bubbles and which adheres to the ceramic body with high adhesion, providing a complete coverage even where the substrate surface of the ceramic body is complicated with a through(hole or the like.

2. Related Art Statement

There are known a number of methods for forming a copper film on a ceramic body. They include chemical solution deposition (electroless plating) of copper, and its vapor deposition, such as vacuum evaporation, sputtering or ion plating. None of these methods, however, are satisfactory in forming a film of copper which firmly adheres to the ceramic substrate or body.

British Patent No. 2 141 741A proposes a method for forming a copper film of improved adhesion to a ceramic substrate. The proposed method utilizes the so-called "anchor effect" which is attained by etching the substrate surface as by alkali fusion. However, this method is difficult to employ for high-yield large-scale production of ceramic bodies carrying copper films with high adhesion, since the etching condition is difficult to control, and is likely to damage the surface layer of the ceramic substrate.

A method for metallizing a ceramic body with copper, which is known as the direct copper bonding technique, is disclosed in a in Japanese Patent Application which was published in 1985 under Publication No. 60-4154 for opposition purpose. According to this method, a relatively thick copper sheet or foil having a very thin surface layer of copper oxide is bonded to a ceramic body by heating at a temperature of 1065° C. to 1083° C. in a nitrogen atmosphere, or at a temperature of 1065° C. to 1083° C. in a nitrogen atmosphere containing a very small amount of oxygen. This method has, however, a lot of disadvantages. The temperature range for the heat treatment and the allowable range of oxygen concentration in the atmosphere are too narrow to be easily attained. During the heat treatment, the copper foil does not deform sufficiently so as to fit the substrate surface snugly, thus failing to easily adhere to the surface. The method cannot be employed for metallizing the surfaces defining holes formed in the substrate, and its application is limited to ceramic bodies having a flat substrate surface. Further, the method in question requires the copper foil to have a relatively large thickness for easy hardling and heat treatment, and the copper film formed by this method cannot be suitably processed by photolithography to form a high-density wiring pattern.

There is also known a copper plating method which relies on the anchor effect of a porous layer, such as porous glass, which is applied to the article such as a ceramic substrate. The porous glass is obtained, for example, by firing glass-containing paste on the substrate. This method has the disadvantage that the presence of the porous layer prevents copper plating of through-hole surfaces, and lowers the thermal conduction between the metal film and the substrate.

SUMMARY OF THE INVENTION

It is accordingly an object of this invention to provide a method by which it is possible to form on a ceramic body a copper film with a high adhesive force to the ceramic body surface, with reduced tendency of blisters and peel-off or flake-off, and with excellent thermal conductivity between the copper film and the ceramic body, which method permits the copper film to cover the entire surface area of the ceramic substrate even when the substrate surface is complicated with holes formed through the substrate.

It is another object of this invention to provide a method of forming a copper film on a ceramic body which is easy to control, and which makes it possible to achieve high-yield large-scale production of ceramic products carrying such a copper film.

These objects of the invention are attained by a method which comprises forming or depositing a film containing copper on a ceramic body, and heating this film and the ceramic body in an oxidizing atmosphere to bond the film now containing oxidized copper to the ceramic body, or alternatively, forming or depositing a film containing copper oxide and heating the film and the ceramic body in a non-reducing atmosphere to bond the film to the ceramic body, thereby preparing in either case a ceramic substrate having a metal oxide film formed thereon, and further, forming a metal film consisting mainly of copper on the metal oxide film and heating the metal film and the ceramic substrate at a temperature not exceeding 1083° C. in a non-oxidizing atmosphere.

This invention is essentially based on the discovery that the oxidized copper or copper oxide forms a strong bond with the ceramic body when they are heated and that the metallic copper forms a strong bond with the metal oxide if they are suitably heated in a non-oxidizing atmosphere, while the copper bonded to the oxide retains its metallic properties such as electric conductivity and thermal conductivity.

The method of this invention essentially comprises two steps. The first step comprises forming a metal oxide film consisting mainly of copper oxide on a ceramic body. This film is formed by forming a film containing copper or copper oxide on the ceramic body and heating them to oxidize the copper and bond the oxidized copper to the body, or alternatively bond the copper oxide to the body under heat. In the second step, a metal film consisting mainly of copper is formed on the surface of the metal oxide film and the whole is heated in a non-oxidizing atmosphere, whereby the metallic copper is bonded to the copper oxide and to the ceramic body. The use of a film forming technique in both of the two steps provides a synergistic effect in assuring improved adhesion of the obtained copper film to the ceramic body, and complete coverage of the substrate surface with the copper film.

According to the instant method, it is possible to form a thin metal film consisting mainly of copper, in which said film adheres firmly to a ceramic body. The film is thin enough to form thereon a pattern of fine wiring lines. High conduction of heat can be maintained between the film and the ceramic body. The film has a uniform thickness irrespective of the surface contour of the ceramic body. Therefore, the method of this invention is useful for a wide range of applications involving the bonding of a metal to a ceramic body. It greatly contributes to improving the quality of, among others, ceramic packages for microcircuits, hybrid integrated circuits, ceramic circuit boards and other electronic components and devices for which copper, which is excellent in electric conductivity and solder wettability, is preferably used.

DETAILED DESCRIPTION OF THE INVENTION

Each of the terms "metal film" and "metal oxide film" as herein used is interpreted to mean a film which contains elemental copper. It may contain any other element in addition to copper. Therefore, the metal film may, for example, consist of a copper alloy, such as a copper-nickel alloy.

The method of this invention may be practiced on any ceramic materials, and preferably on a ceramic body having a surface layer containing aluminum oxide, or a compound which can be converted to aluminum oxide through oxidation, wherein aluminum oxide easily combines with copper oxide. More specifically, the instant method is suitably applied, for example, to an alumina ceramic substrate, a glass-alumina substrate, or an aluminum nitride substrate. Needless to say, the ceramic bodies to be processed by the present method may be properly etched, prior to forming thereon a film containing copper or copper oxide.

Although the method of this invention can be carried out in accordance with any film forming technique, it is preferable, from the standpoint of adhesive strength and thickness uniformity of the film, to employ chemical solution deposition (electroless plating), vapor deposition (such as vacuum evaporation, sputtering, ion plating, and ionized-cluster beam deposition), or printing. More specifically, chemical solution deposition is most preferable for forming a copper film on a metal oxide consisting mainly of copper oxide, since the copper film formed by the chemical solution deposition is given a high adhesive force and a uniform thickness. Further, the chemical solution deposition assures formation of the copper film over the entire surface area of the substrate, even the surface area defining holes formed through the substrate.

As mentioned above, in the case of forming a copper film on a metal oxide consisting mainly of copper oxide by a chemical solution deposition technique, the surface layer of the copper oxide may be reduced before a copper film is formed on the reduced surface layer. In this case, care must be taken not to over-reduce the surface layer of the copper oxide in order to avoid damaging a bonding layer between the copper oxide film and the ceramic body.

Although there is no particular limitation in the thickness of the metal oxide film consisting mainly of copper oxide, the metal oxide film preferably has a thickness of 0.02 to 3 microns to ensure a stable bond between the copper oxide and the ceramic body and between the copper oxide and the metallic copper, and achieve a high yield in the formation of a copper film with high adhesion to the ceramic substrate, wherein the copper film is free from any bubbles or other defects. More preferably, the thickness should be held within a range from 0.5 to 2 microns.

The copper oxide in the metal oxide film is preferably copper(I) oxide or cuprous oxide, as a metal film consisting mainly of copper adheres firmly to the metal oxide film when they are heated.

According to this invention, the heating of the materials in the oxidizing atmosphere is carried out by employing an atmosphere and a temperature which enable oxidation of the metallic copper and bonding of the oxidized copper to the ceramic body. It is usually advisable to effect the heating at a temperature of 400° C. to 1200° C., in air or in a nitrogen atmosphere containing at least about 20 ppm of oxygen.

The heating of the materials in the non-reducing atmosphere is carried out by employing an atmosphere and a temperature which do not allow copper oxide to be reduced into metallic copper, and which permit bonding of the copper oxide to the ceramic body. It is usually advisable to effect the heating at a temperature of 400° C. to 1200° C. in air, nitrogen, or a mixture of nitrogen and oxygen.

The heating of the materials in the non-oxidizing atmosphere employs an atmosphere in which the surface of metallic copper is not oxidized, and a temperature which provides a strong bond of the metallic copper to the copper oxide. Preferably, this heating is carried out at a temperature of 600° C. to 1083° C. in a nitrogen atmosphere containing not more than about 20 ppm of oxygen, or in a mixed gas of nitrogen, hydrogen and water. It is not always necessary to employ the same atmosphere throughout the heating cycle, but it is possible to use, for example, an atmosphere which changes with the temperature.

The thickness of the metal film consisting mainly of copper is varied depending upon the field in which the ceramic body with a copper film to be formed according to the invention is used. Preferably, however, the thickness of the metal film is held between 0.01 and 20 microns, in order to assure sufficient adhesion to the ceramic substrate body, absence of bubbles and other defects, and a high yield of production. The metal film thus formed can be subjected to ordinary electroplating or other plating processes, if necessary.

To further clarify the principle of the present invention, several examples of the invention will now be described, for illustrative purposes only. It is to be understood that the invention is by no means confined to the details of the examples, but may be embodied with various alterations, modifications and improvements which may occur to those skilled in the art, without departing from the spirit and scope of the invention defined in the appended claims.

EXAMPLE 1

A 50×50 mm square, 0.6 mm thick, 96% alumina ceramic substrate having a through hole was cleaned by freon vapor, immersed in a 30 wt.% aqueous solution of sodium hydroxide at 70°C. for 15 minutes, and fully rinsed in water. The substrate was then subjected to a customary electroless copper plating process, wherein the substrate was subjected to alkaline cleaning, immersed in 1:1 hydrochloric acid at ambient temperature for two minutes, treated with a sensitizer solution (OMC-5600S available from Okuno Chemical Industries Co., Ltd.) and an activator solution (OMC-5700A available from the same company), rinsed in water, immersed in an electroless copper plating solution (OPC-Copper available from the same company) at a temperature of 55° C., and stirred by air until a film having a thickness of about 0.5 micron was obtained, rinsed in water, and dried. The copper-plated substrate was heated at 900° C. in an oxidizing atmosphere consisting mainly of nitrogen and containing 200 ppm of oxygen, whereby a metal oxide film consisting mainly of copper (I) oxide was formed on the substrate. After the rinsing in water, the electroless copper plating procedure was repeated to form a copper film having a thickness of three microns, and the substrate was then heat-treated at 1050° C. in a nitrogen atmosphere. Thus, there was obtained a ceramic body metallized with a uniform copper film on its opposite surfaces, with the inner through-hole surface also coated with a copper film (Sample No. 1).

Samples Nos. 2 to 15 were prepared substantially in accordance with the same procedure as used for Sample No. 1, but by changing the oxygen content of the oxidizing atmosphere, the temperature of heating in the oxidizing atmosphere, the thickness of the metal oxide film and the temperature of heating in the non-oxidizing atmosphere, as indicated in Table 1.

Sample No. 4 was obtained by first forming a 5-micron thick copper film by electroless plating technique, then forming a 2-micron thick copper film secondly by electroplating, and subjecting the substrate to a heat treatment at 1070° C. in a nitrogen atmosphere.

EXAMPLE 2

The procedure which was employed for preparing Sample No. 1 in EXAMPLE 1 was repeated for forming a copper film on an aluminum nitride substrate which had been cleaned by freon (Sample No. 16).

EXAMPLE 3

The procedure used for preparing Sample No. 1 in EXAMPLE 1 was repeated for forming a copper film on a thick substrate carrying a dielectric glass film, which had been prepared by printing a dielectric paste of E. I. du Pont de Nemours and Company on a 96% alumina ceramic substrate and firing the applied paste (Sample No. 17).

EXAMPLE 4

A copper film was formed on a ceramic substrate by repeating the same procedure as employed for Sample No. 1 in EXAMPLE 1, except that a metal film containing copper and having a thickness of five microns was formed by vacuum evaporation at a rate of 0.5 micron per minute and a pressure of $10^{-6}$ torr (Sample No. 18). Further samples (Samples Nos. 19 and 20) were also prepared by repeating the same procedure, except that the metal oxide film and the metal film were formed by sputtering (Sample No. 19) or by vacuum evaporation (Sample No. 20). The metal oxide film of Sample No. 19 was formed by sputtering copper oxide.

EXAMPLE 5

A copper film was formed on a ceramic substrate by repeating the same procedure as used for preparing Sample No. 1, except that a metal film containing copper and having a thickness of 10 microns was formed on a metal oxide film by screen printing a copper paste of E. I. du Pont de Nemours and Company (Sample No. 21).

The samples prepared in EXAMPLES 1 to 5 were examined for adhesive strength, solderability and the presence of any blister. The results are shown in TABLE 1. The adhesive strength was tested by soldering a copper wire to a pad formed from a metal film in accordance with a customary photolithography method and by using a Model SV50 pull strength tester available from Imada Seisakusho.

Substantially similar results as shown in Table 1 were obtained by using sensitizer solution, activator solution or electroless copper plating solution available from manufacturers other than Okuno Chemical Industries.

Three samples were prepared for comparative purposes. That is, Sample No. 22 was a 96% alumina ceramic substrate carrying a copper film formed by electroless plating and having a thickness of two microns. Sample No. 23 was prepared by forming a copper film in the same way as on Sample No. 22, and heating it at 1050° C. in a non-oxidizing atmosphere. Sample No. 24 was prepared by forming a copper film in the same way as on Sample No. 22, and heating it at 600° C. in a nitrogen atmosphere containing 100 ppm of oxygen.

The comparative samples were likewise examined. The results are shown in TABLE 2. Sample No. 24 had a metal oxide film, instead of a metal film, on its surface, and could not be tested for adhesive strength because of its poor solderability.

The metal oxide films shown in TABLE 1 were examined for identification (by a Model ESCA 750 apparatus of Shimadzu Seisakusho), using X-ray photoelectron spectroscopy. The films formed by heating in air were found to consist mainly of copper(II) oxide or cupric oxide, while those formed by heating in a nitrogen atmosphere having an oxygen content not exceeding 1000 ppm were found to consist mainly of copper(I) oxide.

It is obvious from TABLES 1 and 2 that the metal films formed by the method of this invention and consisting mainly of copper have a high adhesive strength and a high degree of solderability, and are free of any blisters. The results given in the table also reveal that the method of this invention is effective for forming a copper film with a uniform thickness even on the inner wall of the substrate which defines a through hole.

TABLE 1

| Sample No. | Thickness of metal oxide film (micron) | Temp. of heating in oxidizing atm.(°C.) | Oxygen content of oxidizing atm.(ppm) | Thickness of metal film (mic.) | Temp. of heating in non-ox. atm. (°C.) | Adhesive strength (kg/mm$^2$) | Solderability |
|---|---|---|---|---|---|---|---|
| 1 | 0.5 | 900 | 200 | 3 | 1050 | 7.5 | Good |
| 2 | 0.1 | 900 | 200 | 2 | 1070 | 6.5 | Good |
| 3 | 2 | 900 | 100 | 5 | 1050 | 7.2 | Good |
| 4 | 1 | 1000 | 100 | 7 | 1070 | 8.0 | Good |
| 5 | 0.3 | 500 | 1000 | 4 | 1020 | 3.8 | Good |
| 6 | 0.05 | 600 | Air | 3 | 1000 | 3.1 | Good |
| 7 | 1 | 1000 | 300 | 2 | 1000 | 6.3 | Good |
| 8 | 1 | 900 | Air | 2 | 1010 | 4.5 | Good |
| 9 | 1 | 900 | 200 | 2 | 900 | 6.8 | Good |
| 10 | 5 | 900 | 100 | 10 | 1070 | 2.7 | Good |
| 11 | 0.5 | 900 | 200 | 1 | 500 | 2.2 | Good |
| 12 | 0.1 | 900 | 600 | 0.5 | 700 | 6.1 | Good |
| 13 | 0.5 | 300 | Air | 3 | 1000 | 2.1 | Good |

TABLE 1-continued

| Sample No. | Thickness of metal oxide film (micron) | Temp. of heating in oxidizing atm.(°C.) | Oxygen content of oxidizing atm.(ppm) | Thickness of metal film (mic.) | Temp. of heating in non-ox. atm. (°C.) | Adhesive strength (kg/mm²) | Solderability |
| --- | --- | --- | --- | --- | --- | --- | --- |
| 14 | 1 | 1100 | 100 | 2 | 1000 | 6.3 | Good |
| 15 | 2 | 900 | Air | 1 | 1100 | — | Bad |
| 16 | 0.5 | 900 | 200 | 15 | 1050 | 3.8 | Good |
| 17 | 0.5 | 900 | 200 | 3 | 900 | 4.1 | Good |
| 18 | 0.5 | 900 | 200 | 5 | 600 | 2.1 | Good |
| 19 | 0.1 | 1000 | 10 | 2 | 1000 | 2.8 | Good |
| 20 | 0.1 | 1000 | 300 | 5 | 900 | 2.1 | Good |
| 21 | 0.5 | 900 | 200 | 10 | 1000 | 3.0 | Good |

No blister was found in any of Samples Nos. 1 to 21.

TABLE 2

| Sample No. | Thickness of metal film (micron) | Oxygen content of atmosphere (ppm) | Heating temp. (°C.) | Adhesive strength (kg/mm²) | Solderability | Blister |
| --- | --- | --- | --- | --- | --- | --- |
| 22 | 2 | — | — | Up to 1 | Good | Present |
| 23 | 2 | 5 | 1050 | Up to 1 | Good | Absent |
| 24 | 2 | 100 | 600 | — | Bad | Absent |

What is claimed is:

1. A method of forming a copper film on a ceramic body comprising the steps of:
   depositing a film containing copper oxide on said ceramic body;
   heating said film and said ceramic body at a temperature between 400° C. and 1200° C. in a non-reducing atmosphere to bond said film to said ceramic body, thereby resulting in a ceramic substrate having a metal oxide film bonded thereto;
   depositing a metal film consisting essentially of copper on said metal oxide film; and
   heating said metal film and said ceramic substrate at a temperature up to 1083° C. in a non-oxidizing atmosphere.

2. The method of claim 1, wherein said depositing steps are effected by a process selected from the group consisting of printing, chemical solution deposition and vapor deposition.

3. The method of claim 1, wherein said step of depositing a metal film is effected by chemical solution deposition.

4. The method of claim 1, wherein said ceramic body comprises a substrate which contains a material selected from the group consisting of aluminum oxide and compounds which can be converted to aluminum oxide through oxidation.

5. The method of claim 1, wherein a thickness of said metal oxide film is 0.02–3 microns.

6. The method of claim 1, wherein said metal oxide film consists essentially of copper oxide.

* * * * *